US012724459B2

(12) United States Patent
Kim et al.

(10) Patent No.: US 12,724,459 B2
(45) Date of Patent: Sep. 1, 2026

(54) DISPLAY DEVICE

(71) Applicant: Samsung Display Co., Ltd., Yongin-si (KR)

(72) Inventors: Yun Jae Kim, Cheonan-si (KR); Bu Gyoon Yoo, Hwaseong-si (KR); Dong Ho Lee, Cheonan-si (KR); Joon Hyuk Jang, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/374,666

(22) Filed: Sep. 29, 2023

(65) Prior Publication Data

US 2024/0032325 A1 Jan. 25, 2024

Related U.S. Application Data

(63) Continuation of application No. 17/061,698, filed on Oct. 2, 2020, now Pat. No. 11,805,669.

(30) Foreign Application Priority Data

Mar. 5, 2020 (KR) ........................ 10-2020-0027886

(51) Int. Cl.

| | |
|---|---|
| ***G06F 1/16*** | (2006.01) |
| *H10K 59/80* | (2023.01) |
| *H10K 77/10* | (2023.01) |
| *H10K 102/00* | (2023.01) |

(52) U.S. Cl.

CPC ......... *G06F 1/1652* (2013.01); *H10K 59/873* (2023.02); *H10K 59/8791* (2023.02); *H10K 77/111* (2023.02); *H10K 2102/311* (2023.02)

(58) Field of Classification Search

CPC . G06F 1/1652; G06F 3/0412; H01L 51/5253; H01L 51/5281; G02B 1/14; G09F 9/301

See application file for complete search history.

(56) References Cited

U.S. PATENT DOCUMENTS

| | | | |
|---|---|---|---|
| 9,348,369 | B2 | 5/2016 | Kee et al. |
| 9,356,087 | B1 | 5/2016 | Lee et al. |
| 9,870,023 | B2 | 1/2018 | Namkung et al. |

(Continued)

FOREIGN PATENT DOCUMENTS

| | | |
|---|---|---|
| CN | 106373490 A | 2/2017 |
| KR | 10-2016-0072371 | 6/2016 |

(Continued)

OTHER PUBLICATIONS

Extended European Search Report dated Jul. 13, 2021, in European Patent Application No. EP21160292.5.

(Continued)

*Primary Examiner* — Olga V Merkoulova

(74) *Attorney, Agent, or Firm* — CANTOR COLBURN LLP

(57) ABSTRACT

A display device includes a display panel including a first surface through which an image is displayed, a first bonding layer on the display panel, a window layer on the first bonding layer and including a glass or a quartz, and a protective layer on the window layer and including a polymer film. The protective layer has a larger size than the window layer in a plan view.

18 Claims, 14 Drawing Sheets

(56) References Cited

U.S. PATENT DOCUMENTS 9,923,156 B2 3/2018 Jeong
10,534,400 B2 * 1/2020 Wu ........................ G06F 1/1652
10,698,240 B2 * 6/2020 Kee ..................... G02F 1/13338
10,777,101 B2 9/2020 Park
10,811,623 B2 10/2020 Park et al.
10,868,088 B2 * 12/2020 Bok ........................ H10K 59/40
10,895,773 B1 * 1/2021 Zhang ............... G02F 1/133512
10,910,589 B2 2/2021 Jeong et al.
11,121,202 B2 * 9/2021 Jang ....................... H10K 59/87
11,223,020 B2 1/2022 Zhang et al.
11,232,722 B2 1/2022 Park
11,250,737 B2 2/2022 Park
11,258,040 B2 * 2/2022 Won ........................ H10K 59/12
11,468,832 B2 10/2022 Zhu et al.
11,615,721 B2 3/2023 Park
11,653,532 B2 * 5/2023 Song .................... H10K 77/111 359/461
11,688,308 B2 6/2023 Park
12,211,404 B2 1/2025 Park
2014/0042406 A1 2/2014 Degner et al.
2014/0355195 A1 12/2014 Kee et al.
2015/0036300 A1 2/2015 Park et al.
2015/0201487 A1 * 7/2015 Kee ................... G02F 1/133305 361/749
2015/0230331 A1 8/2015 Lee
2015/0363030 A1 12/2015 Nam et al.
2016/0002103 A1 * 1/2016 Wang ................. B23K 26/0624 428/141
2016/0170443 A1 6/2016 Namkung et al.
2016/0204366 A1 7/2016 Zhang et al.
2016/0209970 A1 7/2016 Lee
2017/0123461 A1 5/2017 Kim et al.
2017/0200915 A1 * 7/2017 Lee ........................ H05K 1/028
2017/0299779 A1 10/2017 Mita et al.
2018/0375043 A1 * 12/2018 Jung ....................... B32B 15/08
2019/0207133 A1 7/2019 Park et al.
2019/0296259 A1 9/2019 Baek et al.
2019/0339741 A1 * 11/2019 Park ..................... H10K 50/125
2019/0341443 A1 * 11/2019 Son ........................ H10K 50/87
2019/0361494 A1 * 11/2019 Wu ..................... H04M 1/0268
2020/0266368 A1 * 8/2020 Park .......................... B32B 7/12
2020/0328375 A1 * 10/2020 Won ....................... H10K 59/40
2021/0041918 A1 * 2/2021 Cho ...................... G06F 1/1652
2021/0050550 A1 2/2021 Kim et al.
2022/0171435 A1 * 6/2022 Cho ...................... G06F 1/1652

FOREIGN PATENT DOCUMENTS

KR 10-2016-0088487 7/2016
KR 10-2019-0070740 6/2019
KR 10-2015126 8/2019
KR 10-2019-0112535 10/2019
KR 1020190128025 A 11/2019
KR 20210050550 2/2021

OTHER PUBLICATIONS

Non-Final Office Action issued Jul. 29, 2022, in U.S. Appl. No. 17/061,698.
Final Office Action issued Dec. 30, 2022, in U.S. Appl. No. 17/061,698.
Notice of Allowance issued Jun. 29, 2023, in U.S. Appl. No. 17/061,698.
Notice of Allowance issued Aug. 3, 2023, in U.S. Appl. No. 17/061,698.
Chinese Office Action for Chinese Application No. 202110223441.8; Report Mail Date Apr. 1, 2026 (16 Pages—with English Translation).

* cited by examiner

EXD: IC, FPCB

DISPLAY DEVICE

CROSS REFERENCE TO RELATED APPLICATION

This application is a Continuation of U.S. patent application Ser. No. 17/061,698, filed on Oct. 2, 2020, which claims priority from and the benefit of Korean Patent Application No. 10-2020-0027886, filed on Mar. 5, 2020, each of which is hereby incorporated by reference for all purposes as if fully set forth herein.

BACKGROUND

Field

Exemplary implementations of the invention relate generally to a display device and, more specifically, to a display device capable of being switched between folded and unfolded positions.

Discussion of the Background

Display devices, which are devices for displaying an image, include display panels such an organic light-emitting diode (OLED) display panel or a liquid crystal display (LCD) panel.

Mobile electronic devices are equipped with display devices to provide images to users. Smaller, thinner mobile electronic devices with larger display screens have increasingly become commonplace, and foldable or bendable display devices that are foldable or bendable to provide larger display screens only when in use have been developed.

A display device may include an upper stack structure, which is disposed on a display panel, and a lower stack structure, which is disposed below the display panel. In the case of a foldable display device, the upper stack structure may slip to protrude outwardly beyond the lower stack structure. The upper stack structure includes a thin window layer.

The above information disclosed in this Background section is only for understanding of the background of the inventive concepts, and, therefore, it may contain information that does not constitute prior art.

SUMMARY

Applicant discovered that the window layer in foldable display devices may be susceptible to external impact when it projects outwardly beyond the lower stack structure due to slippage caused by folding and unfolding.

Display devices constructed according to the principles and exemplary implementations of the invention are capable of preventing external impact on a window layer, and minimizing the dead space in the display device.

Additional features of the inventive concepts will be set forth in the description which follows, and in part will be apparent from the description, or may be learned by practice of the inventive concepts.

According to one aspect of the invention, a display device includes: a display panel having a display area and a non-display area at least partially disposed around the display area, and first and second opposing surfaces; and a first stack structure disposed on the first surface of the display panel including a first layer disposed on the first surface of the display panel, a second layer disposed on the first layer, and a third layer, disposed between the first layer and the second layer; the second layer having a larger size than the first layer in a plan view; and a side surface of the second layer extending outwardly beyond a side surface of the first layer.

The non-display area of the display panel may include a bendable area; and the display panel may be bendable so that portions of the first surface of the display panel may face each other.

A bendable protective layer may be disposed in the bending area, on the first surface of the display panel.

The first layer may include a window layer, the second layer may include a protective layer, the third layer may include a window layer-protective layer bonding, the first stack structure may include an upper stack structure including a polarizing layer disposed between the first surface of the display panel and the window layer, and the polarizing layer may be disposed in the display area.

An external device may be spaced apart from the polarizing layer by the bendable area, wherein the external device may include a driver chip disposed in the non-display area of the display panel, and a printed circuit film may be spaced apart from the driver chip.

The first stack structure may further include a shock absorbing layer, wherein the polarizing layer may be disposed between the shock absorbing layer and the display panel.

The shock absorbing layer may have a side surface of extending inwardly from the side surface of the protective layer.

The side surface of the shock absorbing layer may extend outwardly beyond the side surface of the window layer.

An outer protective layer may be disposed between the shock absorbing layer and the protective layer, wherein the outer protective layer may be spaced apart from the side surface of the window layer.

A second stack structure may be disposed on the second surface of the display panel, wherein the second stack structure may be disposed between portions of the second surface of the display panel that may be bendable to face each other.

The second stack structure may include a lower stack structure including a lower film layer disposed on the second surface of the display panel, and a metal plate may be disposed below the lower film layer.

The side surface of the first layer may be disposed more inwardly than an outermost part of the bendable area of the display panel.

The side surface of the second layer may be disposed more inwardly than the outermost part of the bendable area of the display panel.

According to another aspect of the invention, a display device includes: a display panel having a foldable area, a first non-foldable area disposed on a first side of the folding area, and a second non-foldable area disposed on a second side of the folding area; a first stack structure disposed on a first surface of the display panel; and a second stack structure disposed on a second surface of the display panel, wherein the first stack structure includes a first layer disposed on the first surface of the display panel, a second layer disposed on the first layer, and a third layer disposed between the first layer and the second layer, the second layer has a larger size than the first layer in a plan view, and the second layer has a side surface extending outwardly beyond a side surface of the first layer.

The second layer may include a first surface facing the first layer, and a second surface, opposite to the first surface of the second layer, and when the display device is folded, portions of the second surface of the second layer face each other.

When the display device is folded, a side surface of the first stack structure may move in a direction away from the folding area to the second substantially non-folding area.

The second stack structure may include a lower film layer disposed on the second surface of the display panel, and a metal plate may be disposed below the lower film layer.

The display panel may have a display area and a non-display area at least partially disposed around the display area, the non-display area of the display panel may include a bendable area, the display panel may be bendable so that portions of the second surface of the display panel may face each other, and when the display device is folded, the side surface of the first layer may be disposed more inwardly than an outermost part of the bendable area of the display panel.

When the display device is folded, the side surface of the second layer may be disposed more inwardly than the outermost part of the bendable area of the display panel.

The first layer may include a window layer, and the second layer may include a protective layer, the protective layer having a thickness of about 30 μm to about 50 μm, and the window layer having a thickness of about 30 μm to about 50 μm.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
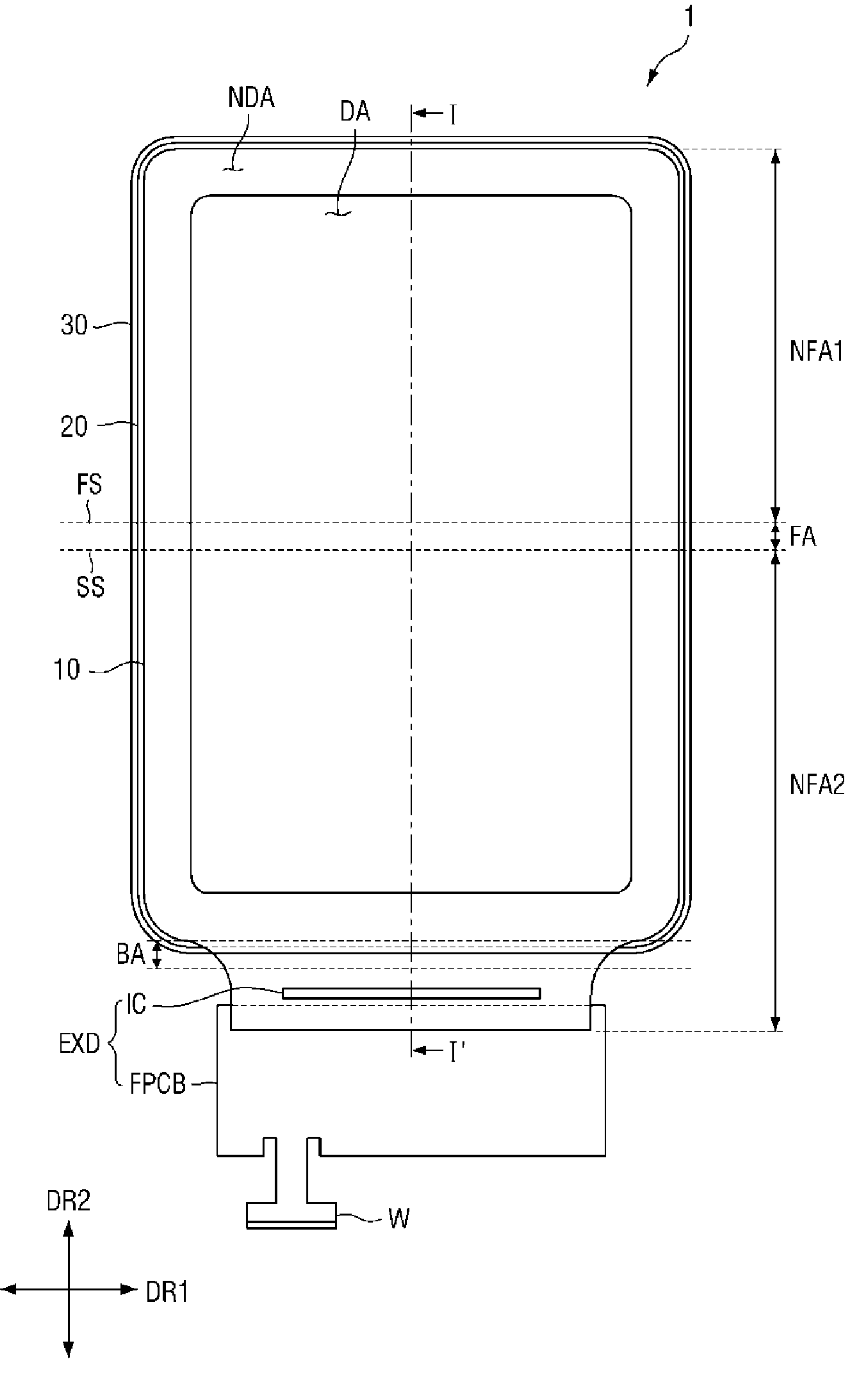
FIG. 1 is a top, plan view of an exemplary embodiment of a display device constructed according to principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements. When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Other expressions that explain the relationship between elements, such as "between," "directly between," "adjacent to," or "directly adjacent to," should be construed in the same way. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items. Or" means "and/or."

Although the terms "first," "second," etc. may be used herein to describe various types of elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, regions, integers, steps, operations, elements, components, and/or groups thereof, but do not preclude the presence or addition of one or more other features, regions, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art. For example, "about" can mean within one or more standard deviations, or within ±30%, 20%, 10% or 5% of the stated value.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a top, plan view of an exemplary embodiment of a display device constructed according to principles of the invention. Referring to FIG. 1, a display device 1 displays an image in a display area DA, and examples of the display device 1 may encompass various devices incorporating such a display device. Examples of the display device 1 include, but are not limited to, a smartphone, a mobile phone, a tablet personal computer (PC), a personal digital assistant (PDA), a portable multimedia player (PMP), a television (TV), a game console, a wristwatch electronic device, a head-mounted display (HMD), a PC monitor, a laptop computer, a car navigation, a car dashboard, a digital camera, a camcorder, an external billboard, an electronic billboard, a medical device, an inspection device, a household appliance (e.g., a refrigerator or a washing machine) with a display area, an Internet of Things (IoT) device, and the like. Examples of a foldable display device that will be described below include, but are not limited to, a smartphone, a tablet PC, a laptop computer, and the like.

The display device 1 may have a substantially rectangular shape in a plan view. Also, the display device 1 may have a generally rectangular shape with generally right-angled or generally rounded corners in a plan view. The generally planar shape of the display device 1 will hereinafter be described as encompassing a generally rectangular shape with generally rounded corners. The display device 1 may have about four sides or edges. The display device 1 may have long sides and short sides.

The short sides of the display device 1 may extend in one direction, and the long sides of the display device 1 may extend in another direction. For example, the short sides of the display device 1 may extend in a first direction DR1, and the long sides of the display device 1 may extend in a second direction DR2. The first and second directions DR1 and DR2 may be different directions that intersect each other. For convenience, FIG. 1, which is a plan view, defines the first and second directions DR1 and DR2 as generally horizontal and generally vertical directions, respectively. One side in the first direction DR1 may refer to a rightward direction, the other side in the second direction DR1 may refer to a leftward direction, one side in the second direction DR2 may refer to a generally upward direction, and the other side in the second direction DR2 may refer to a generally downward direction. These directions, however, should be understood as being relative to one another and being exemplary, and are not particularly limited.

The display device 1 may include a display panel 10, which displays an image, a first stack structure in the form of an upper stack structure 30, a second stack structure in the form of a lower stack structure 20, and an external device EXD, which is attached on the display panel 10. The external device EXD may include a driver chip IC and a printed circuit film FPCB, which is spaced apart from the driver chip IC in the second direction DR2.

Examples of the display panel 10, which is a panel that displays an image, include not only a self-emissive display panel such as an organic light-emitting diode (OLED) display panel, an inorganic electroluminescent (EL) display panel, a quantum-dot light-emitting diode (QLED) display panel, a micro-light-emitting diode (micro-LED) display panel, a nano-light-emitting diode (nano-LED) display panel, a plasma display panel (PDP), a field emission display (FED) panel, or a cathode ray tube (CRT) display panel, but also a light-receiving display panel such as a liquid crystal display (LCD) panel or an electrophoretic display (EPD) panel. The display panel 10 will hereinafter be described, taking an OLED display panel as an example, and unless noted otherwise, an OLED display panel will be referred to simply as the display panel 10. However, the display panel 10 is not limited to an OLED display panel, and various other display panels may also be employed besides those listed above.

Figure 2:
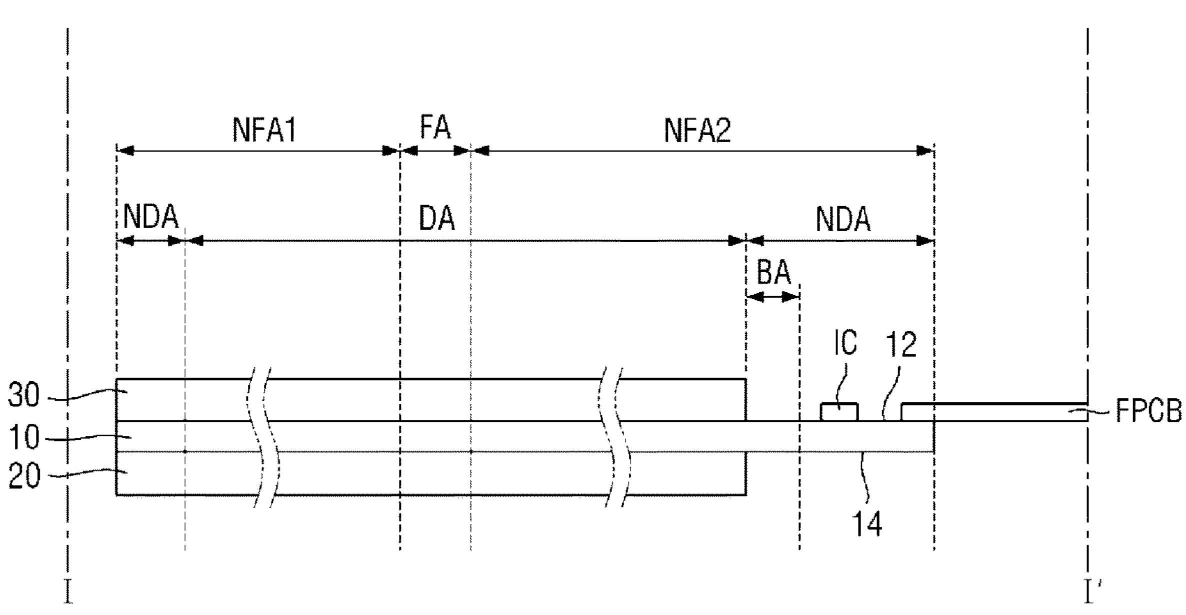
FIG. 2 is a cross-sectional view taken along line I-I' of FIG. 1.
Figure 2:
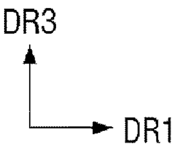

As shown in FIG. 2, the display panel 10 may have a first surface 12 (or a top surface) and a second surface 14 (or a bottom surface). The direction from the second surface 14 to the first surface 12 of the display panel 10 may be the display direction of the display device 1, and the direction from the first surface 12 to the second surface 14 of the display panel may be a direction in which an image is not displayed. However, the exemplary embodiments are not limited to this. Alternatively, the direction from the second surface 14 to the first surface 12 of the display panel 10 and the direction from the first surface 12 to the second surface 14 of the display panel 10 may both be display directions of the display device 1.

The upper stack structure 30 may be disposed on the first surface 12 of the display panel 10, and the lower stack structure 20 may be disposed on the second surface 14 of the display panel 10.

The display device 1 may be a foldable device. The term "foldable device", as used herein, refers to a device that can be folded and encompasses not only a device that is already folded, but also a device that can have both folded and unfolded positions. When the display device 1 is folded, the angle at which the display device 1 is folded may be, but is not limited to, about 180°. Even when the display device 1 is folded at an angle of more than about 180° or less than about 180°, for example, at an angle of about 90° to about 180° or at an angle of about 120° to about 180°, the display device 1 may also be understood as being folded. Not only when the display device 1 is completely folded, but also when the display device 1 is only bent to the extent that the display device 1 barely passes its unfolded position, the display device 1 may be referred to as being in its folded position. For example, when the display device 1 is bent at an angle of about 90° or less, the display device 1 may be referred to as being in the folded position in order for the folded position to be differentiated from the unfolded position where the maximum folding angle of the display device 1 is about 90° or greater. When the display device 1 is folded, the curvature radius of the display device 1 may be about 5 mm or less, preferably, about 1 mm to about 2 mm or about 1.5 mm, but the exemplary embodiments are not limited thereto.

The folded position will hereinafter be referred to as a first operating position, and the unfolded position will hereinafter be referred to as a second operating position. A folding area FA (or a folding axis) and non-folding areas (NFA1 and NFA2) may be defined on the display panel 10.

As will be described below with reference to FIG. 6, in the second operating position of the display device 1, the display panel 10 may be folded along the folding area FA.

The folding area FA may have a generally rectangular shape that extends in the first direction DR1 in a plan view. The folding area FA is illustrated as extending generally parallel to the short sides of the display device 1, but the exemplary embodiments are not limited thereto. Alternatively, the folding area FA may extend generally parallel to the long sides of the display device 1 or may extend at an inclination with respect to the long sides and the short sides of the display device 1.

In one exemplary embodiment, the location of the folding area FA in the display device 1 may be fixed. In other words, one or more folding areas FA may be provided at particular locations in the display device 1. In another exemplary embodiment, the location of the folding area FA in the display device 1 may not be fixed, but can be set freely at various locations.

The first non-folding area NFA1 may be disposed on a first side, in the second direction DR2, of the folding area FA, and the second non-folding area NFA2 may be disposed on a second side, in the second direction DR2, of the folding area FA. In a case where the location of the folding area FA is fixed, the first and second non-folding areas NFA1 and NFA2 may be defined as regions where folding is not performed. However, a bending area BA having a short width in the direction DR1 may be provided in non-folding area NFA2 as shown in FIG. 2 and discussed in more detail below.

In a plan view, the display panel 10 may be divided into a display area DA in which an image is displayed and a non-display area NDA which is disposed around the display area DA.

The display area DA may include a plurality of pixels. The pixels are the basic units for displaying an image. The pixels may include, but are not limited to, red pixels, green pixels, and blue pixels. The pixels may further include white pixels. The pixels may be alternately arranged in a plan view. For example, the pixels may be arranged in rows and columns, but the exemplary embodiments are not limited thereto.

The non-display area NDA may be disposed around the display area DA. The non-display area NDA may surround the display area DA. In one exemplary embodiment, the display area DA may be formed to have a generally rectangular shape, and the non-display area NDA may be disposed along the four sides of the display area DA.

The display area DA may have short sides that extend in, for example, the first direction DR1 and long sides that extend in, for example, the second direction DR2. The non-display area NDA may be disposed along the short sides and the long sides of the display area DA. A black matrix may be disposed in the non-display area NDA of the display panel 10 to prevent light emitted from one representative pixel from leaking to other adjacent pixels.

The display area DA of the display panel 10 may be disposed in and across both the first and second non-folding areas NFA1 and NFA2. The display area DA may be disposed even in the folding area FA, which corresponds to the boundary between the first and second non-folding areas NFA1 and NFA2. That is, the display area DA of the display device 1 may be disposed in succession regardless of the boundaries between the folding area FA and the first and second non-folding areas NFA1 and NFA2. However, the exemplary embodiments are not limited to this. Alternatively, the display area DA may be disposed in the first non-folding area NFA1, but not in the second non-folding area NFA2. Still alternatively, the display area DA may be disposed in the first and second non-folding areas NFA1 and NFA2, but not in the folding area FA.

The non-display area NDA, like the display area DA, may be disposed in the first non-folding area NFA1, the second non-folding area NFA2, and the folding area FA. As will be described later, in the second operating position, the display device 1 may be inwardly folded so that parts of the first surface of the display panel 10 can face each other. In the second operating position, the display device 1 may be folded so that the first surface of part of the display panel in the first non-folding area NFA1 can face the first surface of part of the display panel 10 in the second non-folding area NFA2.

In some exemplary embodiments, the display device 1 may be outwardly folded so that parts of the second surface of the display panel 10 can face each other. The display device 1 may be configured to be inwardly foldable, outwardly foldable, or both. In a case where the display device 1 is both inwardly foldable and outwardly foldable, the display device 1 can be inwardly and outwardly folded along the same area, i.e., the folding area FA. Alternatively, the display device 1 may include a plurality of folding areas FA and can thus be inwardly and outwardly folded along different folding areas FA.

In a plan view, the non-display area NDA, which is disposed along the long sides and the short sides of the display area DA, may have the shape of, for example, a generally rectangular frame with substantially rounded corners. The shape of the non-display area NDA may be formed by the outer profiles of the display area DA, first and second outer profiles of the non-display area NDA that are adjacent to the long sides of the display area DA and extend in the second direction DR2, a third outer profile of the non-display NDA that is adjacent to the short side of the display area DA on a first side, in the second direction DR2, of the display area DA and extends in the first direction DR1, a fourth outer profile of the non-display area NDA that is adjacent to the short side of the display area DA on a second side, in the second direction DR2, of the display area DA and extends in the first direction DR1, and four curved profiles that connect the first, second, third, and fourth outer profiles of the non-display area NDA. Here, the first outer profile is adjacent to the long side of the display area DA on a second side, in the first direction DR1, of the display area DA, and the second outer profile is opposite to the first outer profile.

The non-display area NDA may include a protruding part, which extends outwardly beyond the fourth outer profile, near the short side of the display area DA on the second side, in the second direction DR2, of the display area DA. The width, in the first direction DR1, of the protruding part of the non-display area NDA may be smaller than the width, in the first direction DR1, of the fourth outer profile. The width, in the first direction DR1, of the protruding part of the non-display area NDA may gradually decrease closer to a second side, in the second direction DR2, of the display device 1, but the exemplary embodiments are not limited thereto.

The protruding part of the non-display area NDA may include a bending area BA, as shown in FIG. 2. The bending area BA may have a generally linear shape that extends along the first direction DR1. The bending area BA may be disposed to overlap the fourth outer profile, but the exemplary embodiments are not limited thereto. Alternatively, the bending area BA may be disposed closer to the second side, in the second direction DR2, of the display device 1 than the fourth outer profile. In the bending area BA, the display panel 10 may be bent in the thickness direction. The display device 1 may not only be a foldable device, but also be a bendable device with a bendable display panel 10. The display panel 10 can be bent along the bending area BA. When the display device 1 is bent, parts of the second surface of the display panel 10 may face each other.

The protruding part of the non-display area NDA may be surrounded by a first curved profile that connects the first and fourth outer profiles, a second curved profile that connects the second and fourth outer profiles, a fifth outer profile that connects the first and second curved profiles, and the fourth outer profile. The fifth outer profile may extend along the first direction DR1. The first and second generally curved profiles may be generally inwardly curved profiles, but the exemplary embodiments are not limited thereto.

The external device EXD may be attached to a second side, in the second direction DR2, of the bending area BA. The driver chip IC may be attached between the printed circuit film FPCB and the bending area BA. In the first operating position of the display device 1, the driver chip may be located between the printed circuit film FPCB and the display area DA or between the printed circuit film FPCB and the bending area BA.

The driver chip IC may include driver integrated circuits configured to apply data voltages to the pixels and to control the application of the data voltages and/or scan signals. A plurality of driving pads are disposed at a location in the non-display area NDA where the driver chip IC is attached, and the driver chip IC may be attached to the plurality of driving pads.

The printed circuit film FPCB may be configured to provide data voltage signals, data voltage application control signals and/or scan signal application control signals to the driver chip IC. Also, the printed circuit film FPCB may be configured to provide high-voltage potential signals and low-voltage potential signals to the pixels.

The printed circuit film FPCB may include a connector CN, which is located at an end of the printed circuit film FPCB on a second side, in the second direction DR2, of the printed circuit film FPCB. The connector CN may be connected to a main circuit board.

In a plan view, the upper stack structure 30 and the lower stack structure 20 may be disposed within the display panel 10.

FIG. 2 is a cross-sectional view taken along line I-I' of FIG. 1. Specifically, FIG. 2 is a cross-sectional view of the display device of FIG. 1 in the first operating position.

Referring to FIG. 2, the upper stack structure 30 and the lower stack structure 20 may be disposed in and across the display area DA and the non-display area NDA of the display panel 10. The upper stack structure 30 and the lower stack structure 20 may be disposed in and across the folding area FA and the first and second non-folding areas NFA1 and NFA2.

Figure 3:
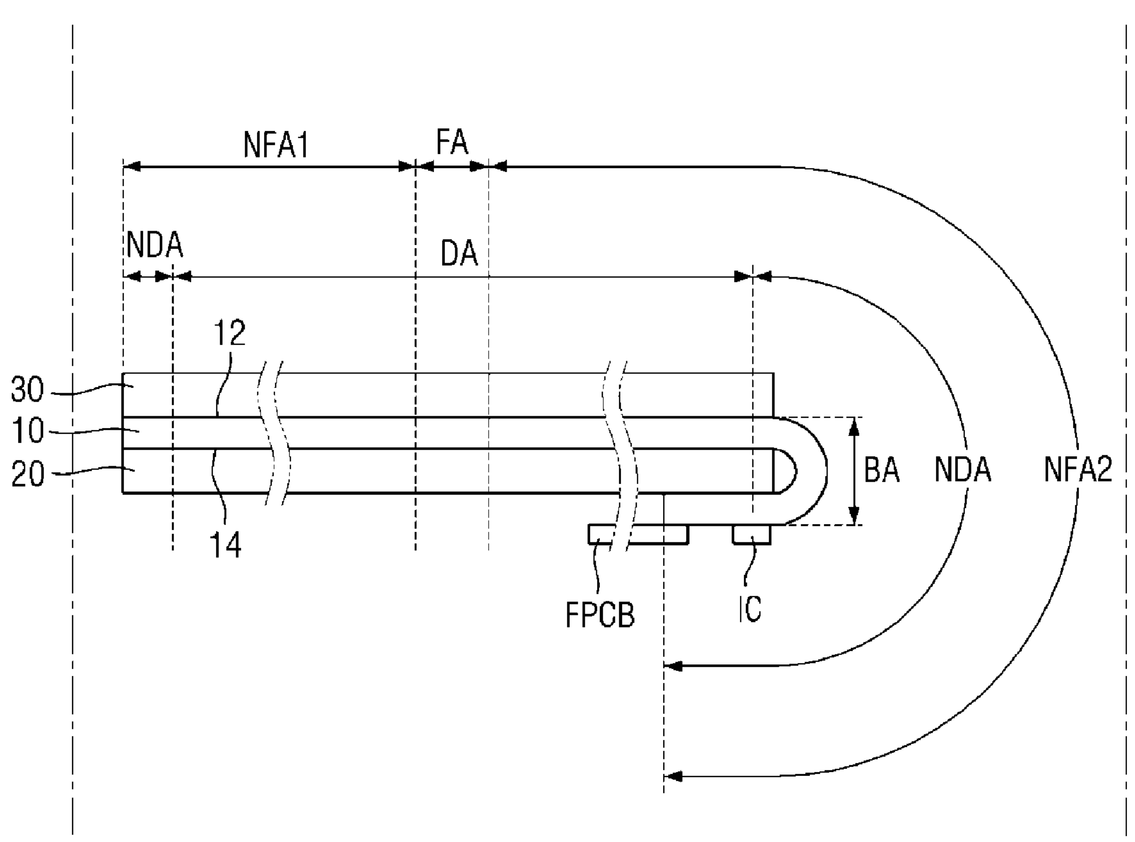
FIG. 3 is a cross-sectional view of the display device of FIG. 2 in a bent position.
Figure 3:
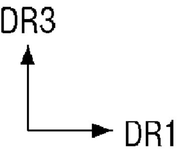

FIG. 3 is a cross-sectional view of the display device of FIG. 2 in a bent position.

Referring to FIG. 3, the display device 1 may be bent along the bending area BA so that parts of the second surface of the display panel 10 can face each other. The driver chip IC and the printed circuit film FPCB may be disposed to overlap with the lower stack structure in the thickness direction. For example, the driver chip IC and the printed circuit film FPCB may be disposed below the lower stack structure 20.

Figure 4:
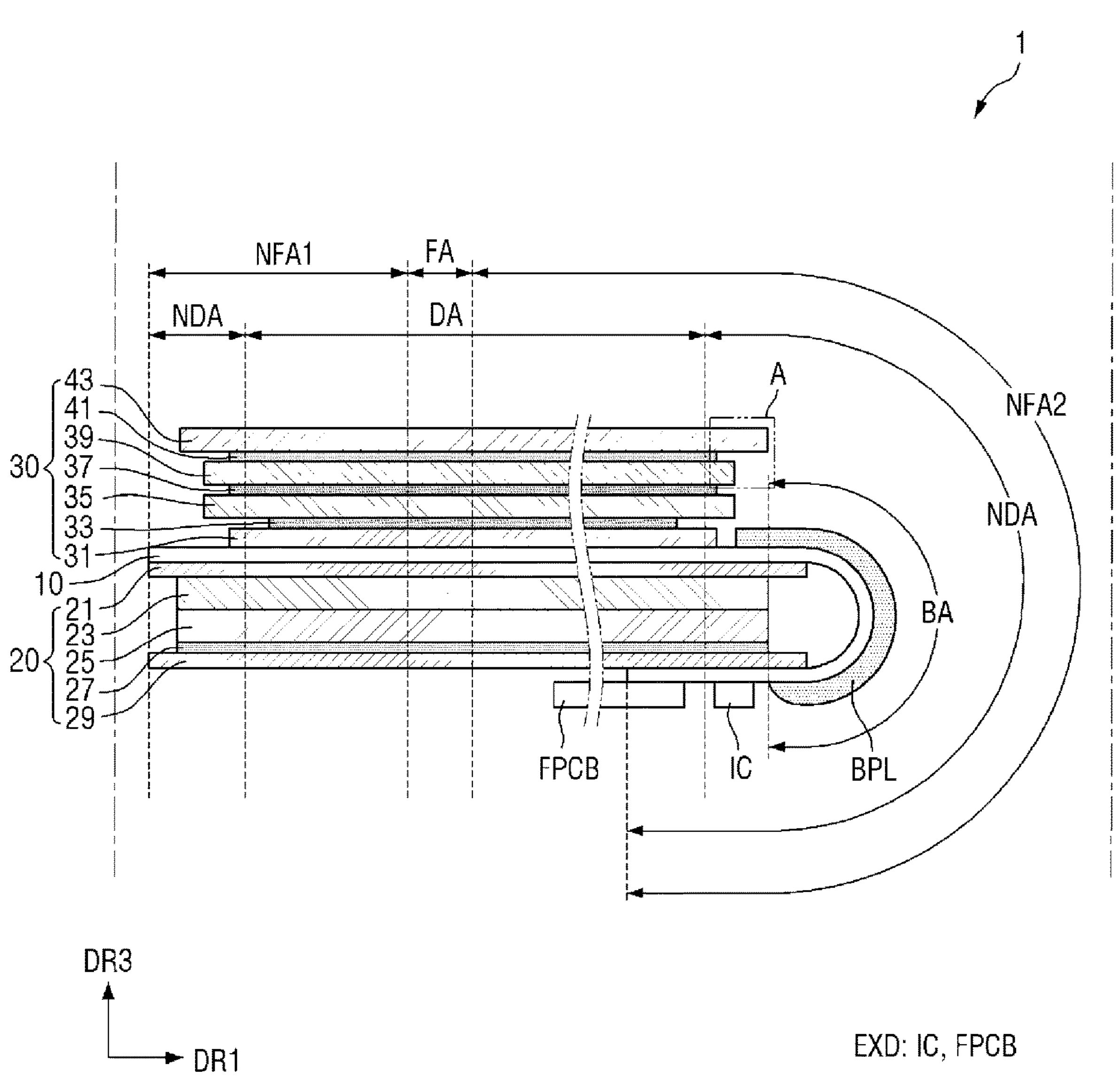
FIG. 4 is a detailed cross-sectional view of the display device of FIG. 3.
Figure 5:
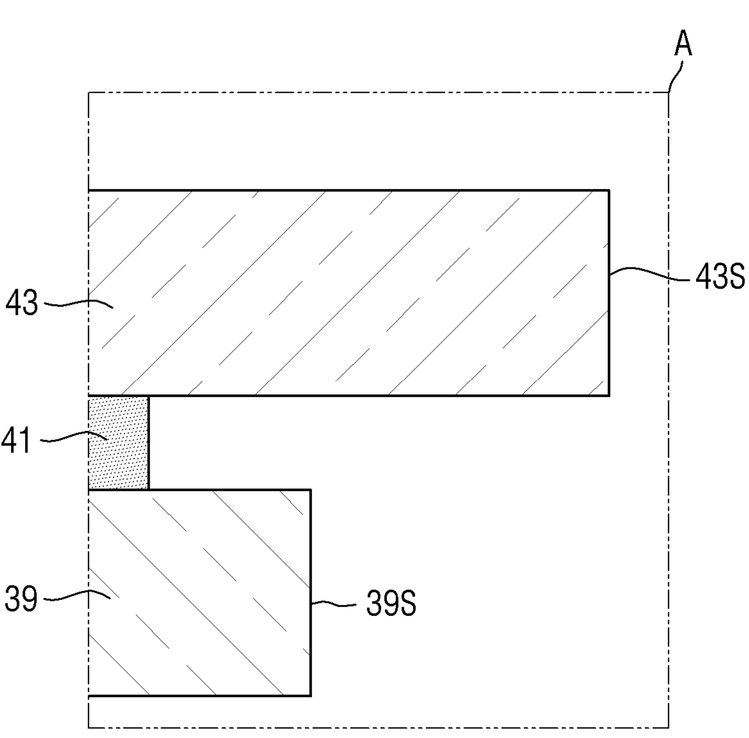
FIG. 5 is an enlarged cross-sectional view illustrating an area A of FIG. 4.

FIG. 4 is a detailed cross-sectional view of the display device of FIG. 3. FIG. 5 is an enlarged cross-sectional view illustrating an area A of FIG. 4.

Referring to FIGS. 4 and 5, the display panel 10 may include a plurality of elements. For example, the display panel 10 may include a substrate and a circuit driving layer, which is disposed on the substrate. The substrate may include a flexible substrate. The flexible substrate may include a flexible insulating material such as a polymer resin. Examples of the polymer resin include a polyethersulphone (PES), a polyacrylate (PA), a polyarylate (PAR), a polyetherimide (PEI), a polyethylene naphthalate (PEN), a polyethylene terephthalate (PET), a polyphenylene sulfide (PPS), a polyallylate, a polyimide (PI), a polycarbonate (PC), a cellulose triacetate (CAT), a cellulose acetate propionate (CAP), and a combination thereof. In one exemplary embodiment, the substrate may include a polyimide (PI), but the exemplary embodiments are not limited thereto.

The circuit driving layer may include circuitry for driving light-emitting layers of the pixels. The circuit driving layer may include a plurality of thin-film transistors (TFTs). The light-emitting layers may be disposed on the circuit driving layer. The light-emitting layers may include organic light-emitting layers. The light-emitting layers may emit light at various luminances depending on driving signals transmitted thereto from the circuit driving layer. An encapsulation layer may be disposed may be disposed on the light-emitting layers. The encapsulation layer may include an inorganic film or a stack of an inorganic film and an organic film. Alternatively, a glass or an encapsulation film may be used as the encapsulation layer. A touch layer may be disposed on the encapsulation layer. The touch layer, which is a layer that recognizes touch input, may serve as a touch member. The touch layer may include a plurality of sensing areas and sensing electrodes.

A bendable protective layer BPL may be disposed on the first surface of the display panel 10, in the bending area BA. The bendable protective layer BPL may alleviate stress applied to signal wiring that passes through the bending area BA, for example, signal wiring that connects the pixels and the driving pads, and may thus prevent cracks in the signal wiring.

For example, the bendable protective layer BPL may include an organic material. The organic material may include a photosensitive organic material. For example, the bendable protective layer BPL may include an acrylic material. The bendable protective layer BPL may extend beyond the bending area BA toward the display area DA. The bendable protective layer BPL may not be in contact with an outer side surface of a polarizing layer 3 that will be described below, but the exemplary embodiments are not limited thereto. Alternatively, the bendable protective layer BPL may be in contact with the outer side surface of the polarizing layer 31.

The lower stack structure 20 may be disposed on the second surface of the display panel 10. The lower stack structure 20 may be disposed between parts of the second surface of the display panel 10 that are bent to face each other.

The lower stack structure 20 may include a first lower film layer 21, a buffer member 23, which is disposed on the bottom surface of the first lower film layer 21, a metal plate 25, which is disposed on the bottom surface of the buffer member 23, a spacer 27, which is disposed on the bottom surface of the metal plate 25, and a second lower film layer 29, which is disposed on the bottom surface of the spacer 27.

The first and second lower film layers 21 and 29 may be disposed in the folding area FA and the first and second substantially non-folding areas NFA1 and NFA2. The first and second lower film layers 21 and 29 may have a larger size than the buffer member 23, the metal plate 25, and the spacer 27 in a plan view, but the exemplary embodiments are not limited thereto.

The first and second lower film layers 21 and 29 may include a film material. For example, the first and second lower film layers 21 and 29 may include a polyethersulphone (PES), a polyacrylate (PA), a polyarylate (PAR), a polyetherimide (PEI), a polyethylene naphthalate (PEN), a polyethylene terephthalate (PET), a polyphenylene sulfide (PPS), a polyallylate, a polyimide (PI), a polycarbonate (PC), a cellulose triacetate (CAT), a cellulose acetate propionate (CAP), and a combination thereof.

The buffer member 23 may include a foam material. The buffer member 23 may be disposed in the folding area FA and the first and second substantially non-folding areas NFA1 and NFA2. In some exemplary embodiments, the buffer member 23 may include a groove in the folding area FA that is recessed toward the display direction, but the exemplary embodiments are not limited thereto.

The metal plate 25 may include a metal with excellent thermal conductivity such as copper (Cu), silver (Ag), or the like. The metal plate 25 may be a heat dissipation sheet including graphite or carbon nanotubes. The metal plate 25 may be disposed in the folding area FA and the first and second substantially non-folding areas NFA1 and NFA2.

In some exemplary embodiments, the metal plate 25 may have different shapes in the folding area FA and in the first and second substantially non-folding areas NFA1 and NFA2. For example, the metal plate 25 may be formed as a single pattern in each of the first and second substantially non-folding areas NFA1 and NFA2 and as a plurality of patterns in the folding area FA. Since the metal plate 25 is formed as a plurality of patterns in the folding area FA, folding stress can be reduced in the second operating position of the display device 1.

In some exemplary embodiments, the metal plate 25 may not be disposed in the folding area FA. For example, metal plates 25 may be disposed in the first and second substantially non-folding areas NFA1 and NFA2, but not in the folding area FA, so that the metal plates 25 may be spaced apart from each other by the folding area FA.

The spacer 27 may be disposed below the metal plate 25. The spacer 27 may be disposed in the folding area FA and in the first and second substantially non-folding areas NFA1 and NFA2. The spacer 27 may include an organic insulating material. The spacer 27 may not be provided.

The second lower film layer 29 may be disposed below the spacer 27. The material and the location of the second lower film layer 29 have already been described above, and thus, detailed descriptions thereof will be omitted to avoid redundancy. The second lower film layer 29 may not be provided.

When the display panel 10 is bent along the bending area BA, part of the second surface of the display panel 10 may be disposed below the lower stack structure 20, particularly, below the second lower film layer 29.

In some exemplary embodiments where the spacer 27 and the second lower film layer 29 are not provided, lower sheets may be further disposed below the metal plate 25. The lower sheets may be disposed in the first and second substantially non-folding areas NFA1 and NFA2, but not in the folding area FA. The lower sheets may be spaced apart from each other by the folding area FA.

The cross-sectional structure and shape of the lower stack structure 20 of FIG. 4 may correspond to the cross-sectional structure and shape of a fourth outer profile part adjacent to the bending area BA, and the cross-sectional structure and shape of a lower stack structure where the spacer 27 and the second lower film layer 29 are not provided and the lower sheets are further disposed below the metal plate 25 may correspond to the cross-sectional structure and shape of the entire display device 1 except for the fourth outer profile part (e.g., first through third outer profile parts and the display area DA).

In one exemplary embodiment, lower bonding layers may be disposed between the elements of the lower stack structure 20. The lower bonding layers may include an adhesive. For example, the lower bonding layers may include a pressure sensitive adhesive (PSA).

The upper stack structure 30 may be disposed on the top surface of the display panel 10. The upper stack structure 30 may include a polarizing layer 31, a shock absorbing layer 35, which is disposed on the polarizing layer 31, a first layer in the form of a window layer 39, which is disposed on the shock absorbing layer 35, and a second layer in the form of a protective layer 43, which is disposed on the window layer 39.

The polarizing layer 31 may reduce the reflection of external light. The polarizing layer 31 may be disposed in the display area DA, but not in the non-display area NDA. A polarizing layer-display panel bonding layer may be disposed between the polarizing layer 31 and the display panel 10. The polarizing layer-display panel bonding layer may include an optically transparent bonding layer or a transparent bonding resin. For example, the polarizing layer-display panel bonding layer may include an optically transparent PSA.

The shock absorbing layer 35 may be disposed on the polarizing layer 31. The shock absorbing layer 35 may include a foam material. The shock absorbing layer 35 may be disposed in the folding area FA and in the first and second substantially non-folding areas NFA1 and NFA2. The shock absorbing layer 35 may not be provided.

An absorbing layer-polarizing layer bonding layer 33 may be disposed between the polarizing layer 31 and the shock absorbing layer 35. The absorbing layer-polarizing layer bonding layer 33 may include an optically transparent bonding layer or a transparent bonding resin. For example, the absorbing layer-polarizing layer bonding layer 33 may include an optically transparent PSA.

The window layer 39 may be disposed on the shock absorbing layer 35. The window layer 39 may include a material such as a glass or a quartz. The side surfaces of the window layer 39 may be disposed to protrude outwardly (in a direction from the folding area FA to the first or second substantially non-folding area NFA1 or NFA2) beyond the side surfaces of the shock absorbing layer 35. In other words, the side surfaces of the shock absorbing layer 35 may be recessed inwardly (in a direction from the first or second substantially non-folding area NFA1 or NFA2 to the folding area FA) from the side surfaces of the window layer 39.

The thickness of the window layer 39 may be about 30 μm to about 50 μm. The window layer 39, which has a small thickness, may be susceptible to external shock. The window layer 39 may be strengthened. The strengthened window layer 39 may have a predetermined stress profile therein. The strengthened window layer 39 can better prevent the generation and propagation of cracks upon external shock and damage caused by external shock than when the window layer 39 is not strengthened. The strengthened window layer 39 may have different types of stresses in different regions thereof. For example, compression regions where compressive stress is applied may be disposed near the surfaces of the window layer 39, i.e., near the first and second surfaces of the window layer 39, and a tensile region where tensile stress is applied may be disposed inside the window layer 39. The stress at the boundaries between the compressive regions and the tensile region may be zero. Compressive stress may vary within each of the compressive regions depending on the location (i.e., the depth from the surfaces of the window layer 39). Also, tensile stress may vary within the tensile stress depending on the depth from the surfaces of the window layer 39.

The compressive regions resist external shock to prevent the window layer 39 from cracking or being damaged. Also, even if cracks are generated, the compressive regions may prevent the propagation of the cracks.

Compression depth prevents cracks formed on the first and second surfaces of the window layer 39 from being propagated into the tensile region in the window layer 39. The greater the compression depth is, the better the propagation of cracks can be prevented.

As described above, if the window layer 39 is formed to be as thin as about 30 μm to about 50 μm, the compressive regions may be formed to have a small compression depth. As a result, cracks or grooves may be easily propagated into the tensile region in the window layer 39. If cracks or grooves are propagated into the tensile region, the window layer 39 may be broken and shattered.

A third layer in the form a window layer-shock absorbing layer bonding layer 37 may be disposed between the window layer 39 and the shock absorbing layer 35. The window layer-shock absorbing layer bonding layer 37 may include an optically transparent bonding layer or a transparent bonding resin. For example, the window layer-shock absorbing layer bonding layer 37 may include an optically transparent PSA.

The protective layer 43 may be disposed on the window layer 39. The protective layer 43 may perform at least one of a scattering prevention function, a shock absorption function, a scratch prevention function, an anti-fingerprint function, and antiglare function. The protective layer 43 may include a transparent polymer film. The transparent polymer film may include at least one of a polyethylene terephthalate (PET), a polyethylene naphthalate (PEN), a polyimide (PI), a polyarylate (PAR), a polymethyl methacrylate (PMMA), and a cycloolefin copolymer (COC) resin.

The thickness of the protective layer 43 may be about 30 μm to about 50 μm.

A protective layer-window layer bonding layer 41 may be disposed between the protective layer 43 and the window layer 39. The protective layer-window layer bonding layer 41 may include an optically transparent bonding layer or a transparent bonding resin. For example, the protective layer-window layer bonding layer 41 may include an optically transparent PSA.

The protective layer 43 may have a larger size than the window layer 39 in a plan view.

As described below, in the second operating position of the display device 1, the side surfaces of the upper stack structure 30 may slip outwardly (in the direction from the folding area FA to the first or second substantially non-folding area NFA1 or NFA2). For example, in the second operating position of the display device 1, the side surfaces of the window layer 39 may slip outwardly (in the direction from the folding area FA to the first or second substantially non-folding area NFA1 or NFA2). When the side surfaces of the window layer 39 slip outwardly (in the direction from the folding area FA to the first or second substantially non-folding area NFA1 or NFA2), peripheral parts of the window layer 39, for example, end parts of the window layer 39 in the first and second substantially non-folding areas NFA1 and NFA2, may become susceptible to external shock. As already mentioned above, since the window layer 39 is as thin as about 30 μm to about 50 μm, the durability of the window layer 39 against external shock may be low.

The side surfaces of the protective layer 43, which is disposed on the window layer 39, may be designed to protrude outwardly beyond the side surfaces of the window layer 39 in consideration that in the second operating position of the display device 1, the side surfaces of the window layer 39 slip outwardly (in the direction from the folding area FA to the first or second substantially non-folding area NFA1 or NFA2).

In the second operating position of the display device 1, the side surfaces of the protective layer 43 may also slip outwardly (in the direction from the folding area FA to the first or second substantially non-folding area NFA1 or NFA2).

The side surfaces of the protective layer 43 and the side surfaces of the window layer 39 may be designed to fall on the inside of the outermost part of the bending area BA of the display panel 10 when the display panel 10 is bent. As a result, dead space in the display device 1 can be prevented from increasing due to the protective layer 43 and the window layer 39 being projected outwardly beyond the display panel 10.

As illustrated in FIG. 5, a side surface 39S of the window layer 39 may be located more inwardly than a side surface 43S of the protective layer 43 (in a direction from the non-display area NDA to the display area DA).

Figure 6:
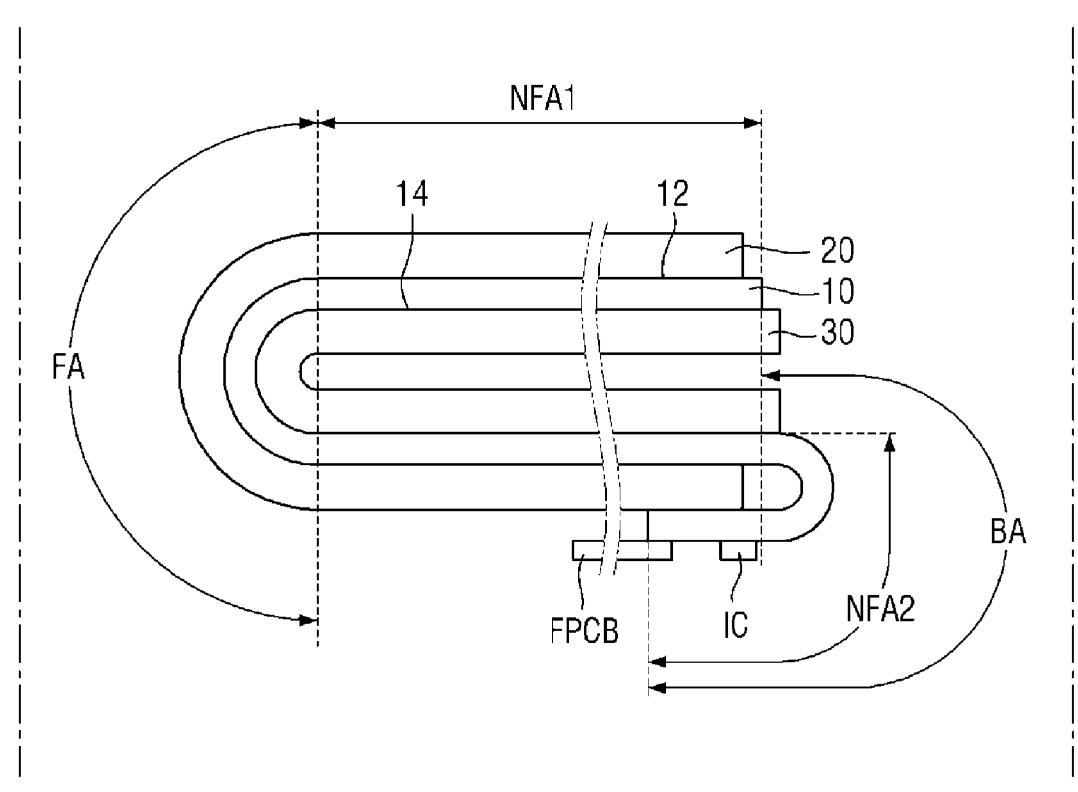
FIG. 6 is a cross-sectional view of the display device of FIG. 3 in a second operating position.
Figure 6:
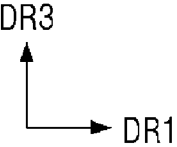
Figure 7:
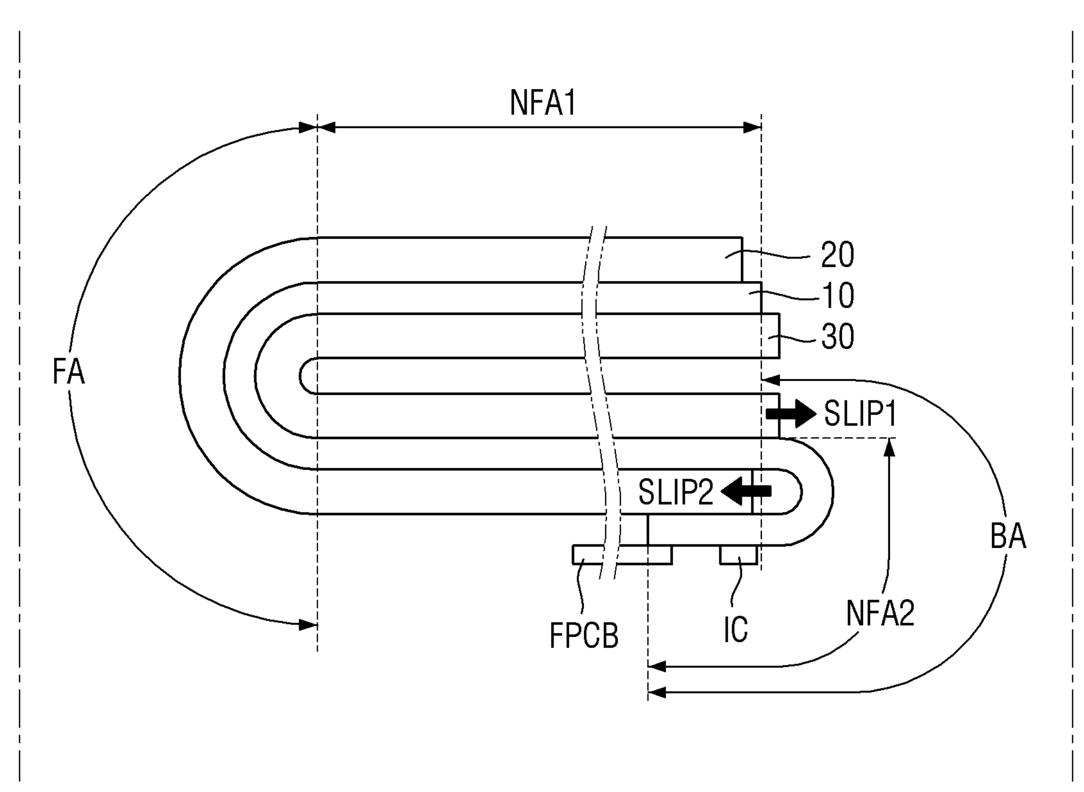
FIGS. 7 and 8 are cross-sectional views illustrating slippage of the upper and lower stack structures of the display device of FIG. 1.
Figure 7:
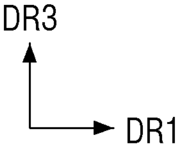
Figure 8:
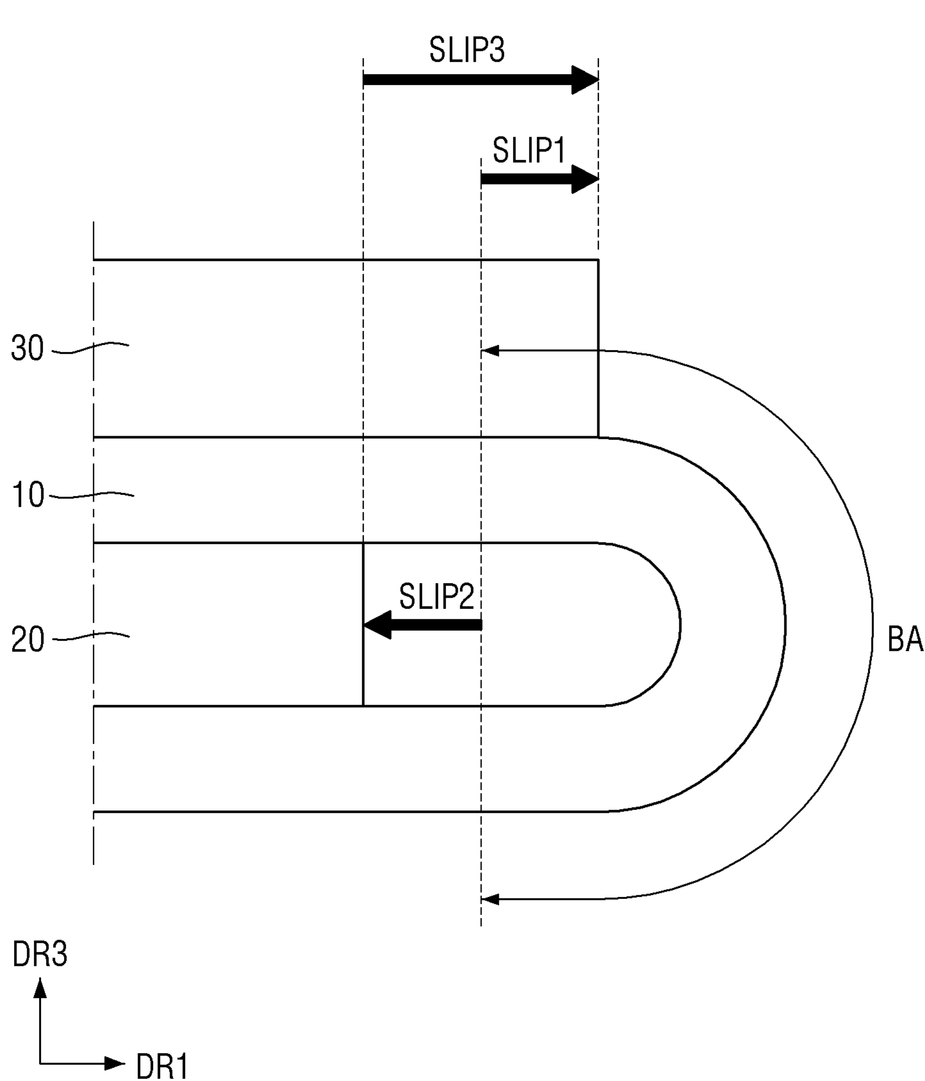
Figure 9:
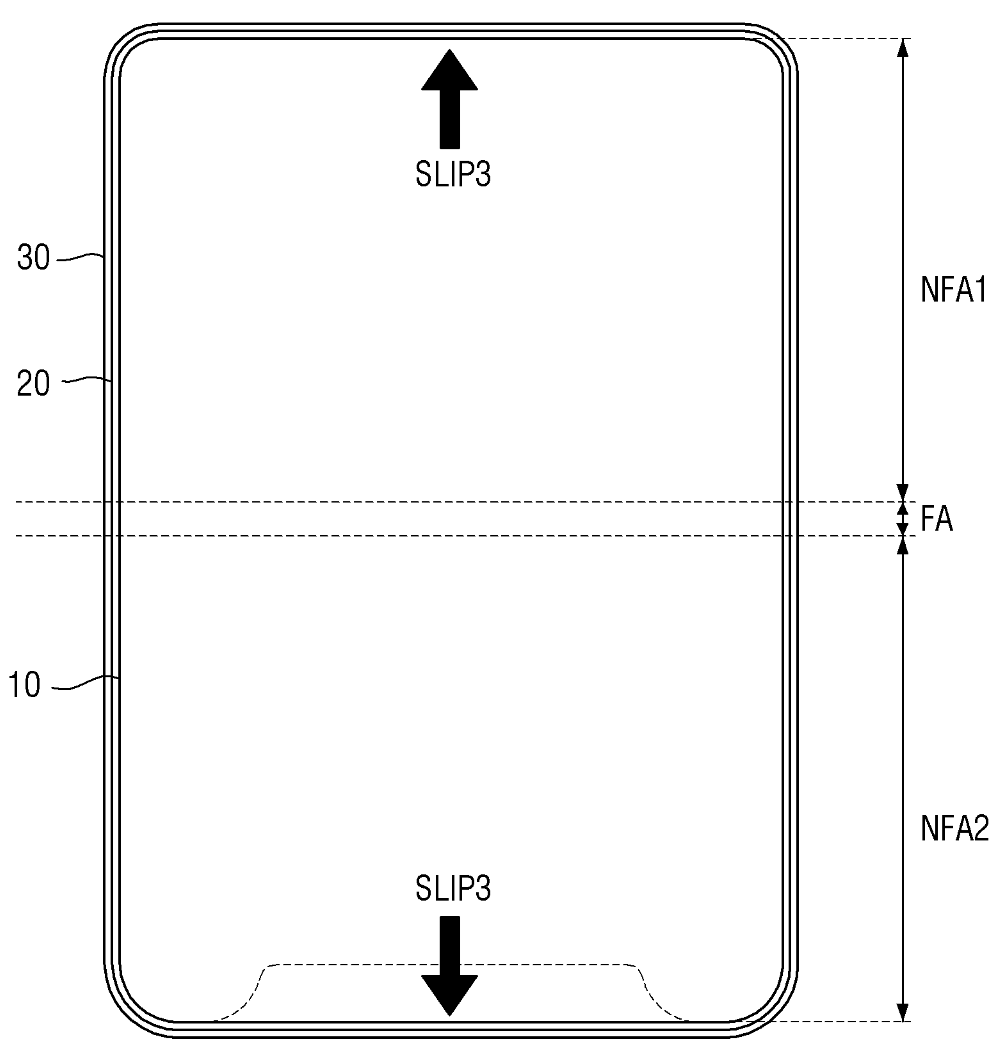
FIG. 9 is a top, plan view illustrating slippage of the display device of FIG. 1.
Figure 9:
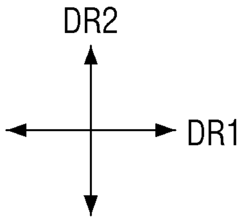

FIG. 6 is a cross-sectional view of the display device of FIG. 3 in a second operating position. FIGS. 7 and 8 are cross-sectional views illustrating slippage of the upper and lower stack structures of the display device of FIG. 1. FIG. 9 is a top, plan view illustrating slippage of the display device of FIG. 1. Referring to FIGS. 6 through 9, in the second operating position, the display device 1 may be inwardly folded so that parts of the first surface of the display panel 10 can face each other. In the second operating position, the display device 1 may be folded so that the first surface of the first non-folding area NFA1 of the display panel 10 can face the first surface of the second substantially non-folding area NFA2 of the display panel 10. The upper stack structure 30 may have a first surface that is adjacent to the first surface of the display panel 10 and a second surface that is opposite to the first surface of the upper stack structure 30. In the second operating position, the display device 1 may be folded so that the second surfaces of the first and second substantially non-folding areas NFA1 and NFA2 of the upper stack structure 30 can face each other around the folding area FA.

As illustrated in FIGS. 7 through 9, in the second operating position of the display device 1, the upper stack structure 30 and the lower stack structure 20 may slip in different directions. In the second operating position where the display device 1 is inwardly folded, the upper stack structure 30 may slip outwardly (in the direction from the folding area FA to the first or second substantially non-folding area NFA1 or NFA2), as indicated by "SLIP1", and the lower stack structure 20 may slip inwardly (in the direction from the first or second substantially non-folding area NFA1 or NFA2 to the folding area FA), as indicated by "SLIP2". Here, "SLIP1" and "SLIP2" may refer to the outward movement of the side surfaces of the upper stack structure 30 and the inward movement of the side surfaces of the lower stack structure 20, respectively, when the display device 1 is switched from the first operating position to the second operating position. "SLIP3" may refer to the sum of the amounts of "SLIP1" and "SLIP2" regardless of the directions of "SLIP1" and "SLIP2", and the direction of "SLIP3" may be a direction from the side surfaces of the lower stack structure 20 to the side surfaces of the upper stack structure 30 in the second operating position of the display device 1.

Figure 10:
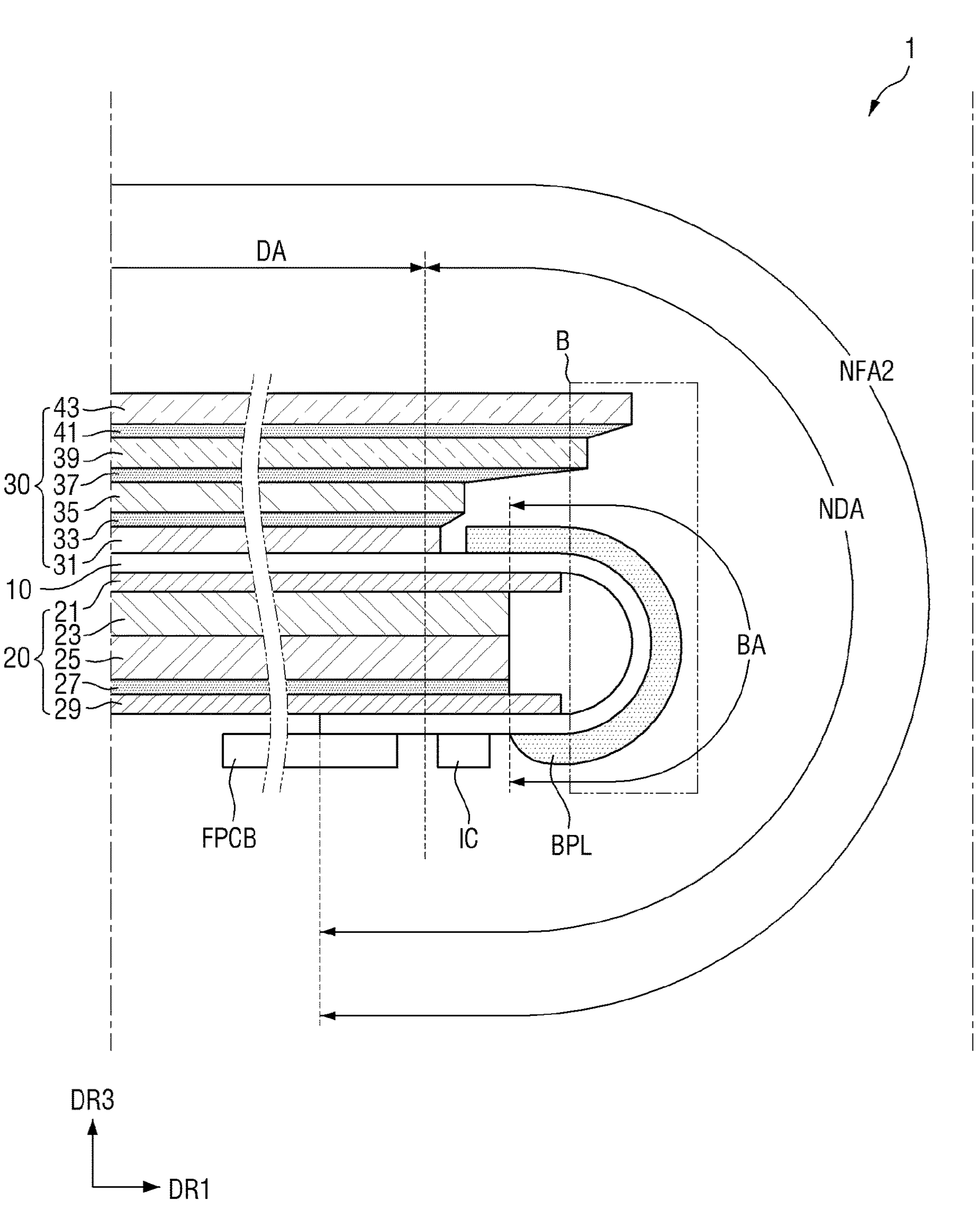
FIG. 10 is a detailed cross-sectional view of the display device of FIG. 6.
Figure 11:
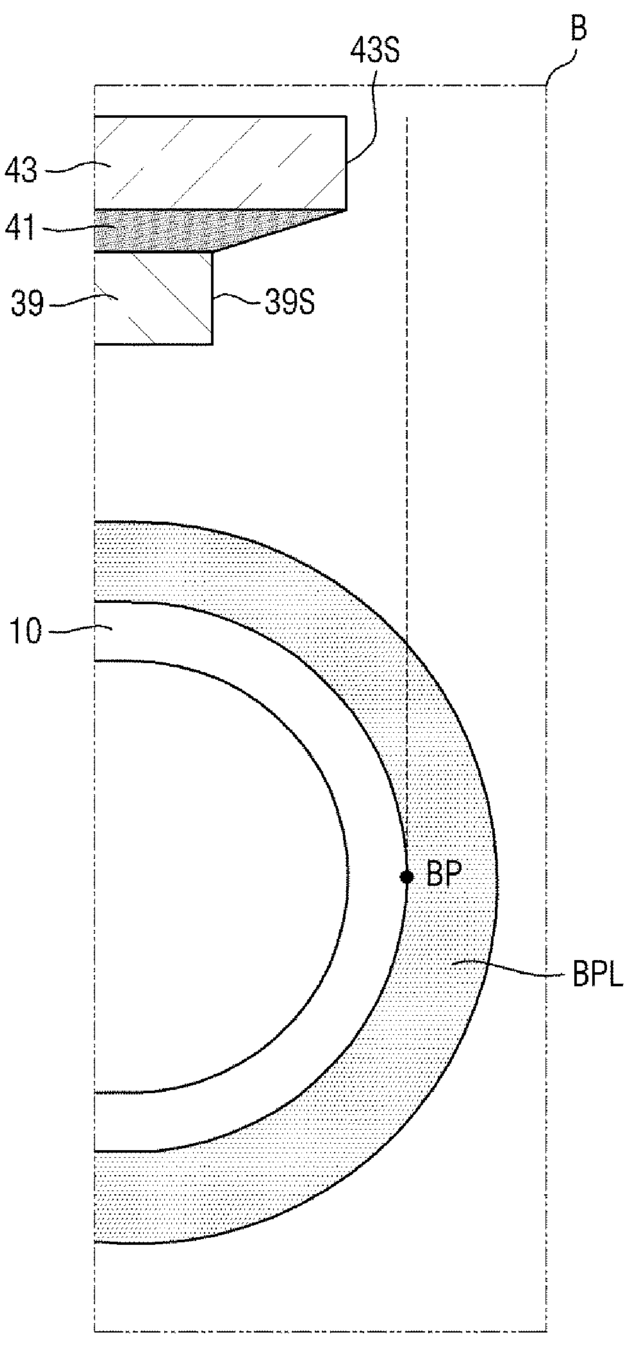
FIG. 11 is an enlarged cross-sectional view of an area B of FIG. 10.

FIG. 10 is a detailed cross-sectional view of the display device of FIG. 6. FIG. 11 is an enlarged cross-sectional view of an area B of FIG. 10.

Referring to FIGS. 10 and 11, the amount by which the upper stack structure 30 slips may increase in a direction away from the display panel 10. For example, the amount by which the upper stack structure 30 slips may gradually decrease from the protective flayer 43 to the window layer 39 to the shock absorbing layer 35 to the polarizing layer 31.

As described above, in the second operating position of the display device 1, the side surface 39S of the window layer 39 may slip outwardly (in the direction from the folding area FA to the first or second substantially non-folding area NFA1 or NFA2). When the side surface 39S of the window layer 39 slips outwardly (in the direction from the folding area FA to the first or second substantially non-folding area NFA1 or NFA2), the peripheral parts of the window layer 39 (e.g., the end parts of the window layer 39 in the first and second substantially non-folding areas NFA1 and NFA2) may become susceptible to external shock. As already mentioned above, since the window layer 39 is as thin as about 30 μm to about 50 μm, the durability of the window layer 39 against external shock may be low. Accordingly, when the side surface 39S of the window layer 39 slips outwardly (in the direction from the folding area FA to the first or second substantially non-folding area NFA1 or NFA2), the peripheral parts of the window layer 39 (e.g., the end parts of the window layer 39 in the first and second substantially non-folding areas NFA1 and NFA2) may be broken and shattered.

The protective layer 43 may have a larger size than the window layer 39 in a plan view. The side surface 43S of the protective layer 43, which is disposed on the window layer 39, may be located more outwardly than (or extend outwardly beyond) the side surface 39S of the window layer 39 (in the direction from the folding area FA to the first or second substantially non-folding area NFA1 or NFA2).

Thus, when the side surface 39S of the window layer 39 slips outwardly (in the direction from the folding area FA to the first or second substantially non-folding area NFA1 or NFA2), the peripheral parts of the window layer 39 (e.g., the end parts of the window layer 39 in the first and second substantially non-folding areas NFA1 and NFA2) can be prevented from being damaged, or any cracks or grooves on the window layer 39 can be prevented from being propagated further into the window layer 39. Therefore, the window layer 39 can be prevented in advance from being broken and shattered.

Also, the side surface 39S of the window layer 39 and the side surface 43S of the protective layer 43 may be designed to be disposed more inwardly than part of the bending area BA of the display panel 10 where an extension of the third direction DR3 and the first surface of the bending area BA of the display panel 10 meet when the display panel 10 is bent, i.e., an outermost part BP. Accordingly, the dead space of the display device 1 can be prevented from increasing due to the protective layer 43 and the window layer 39 being projected outwardly beyond the display panel 10.

Figure 12:
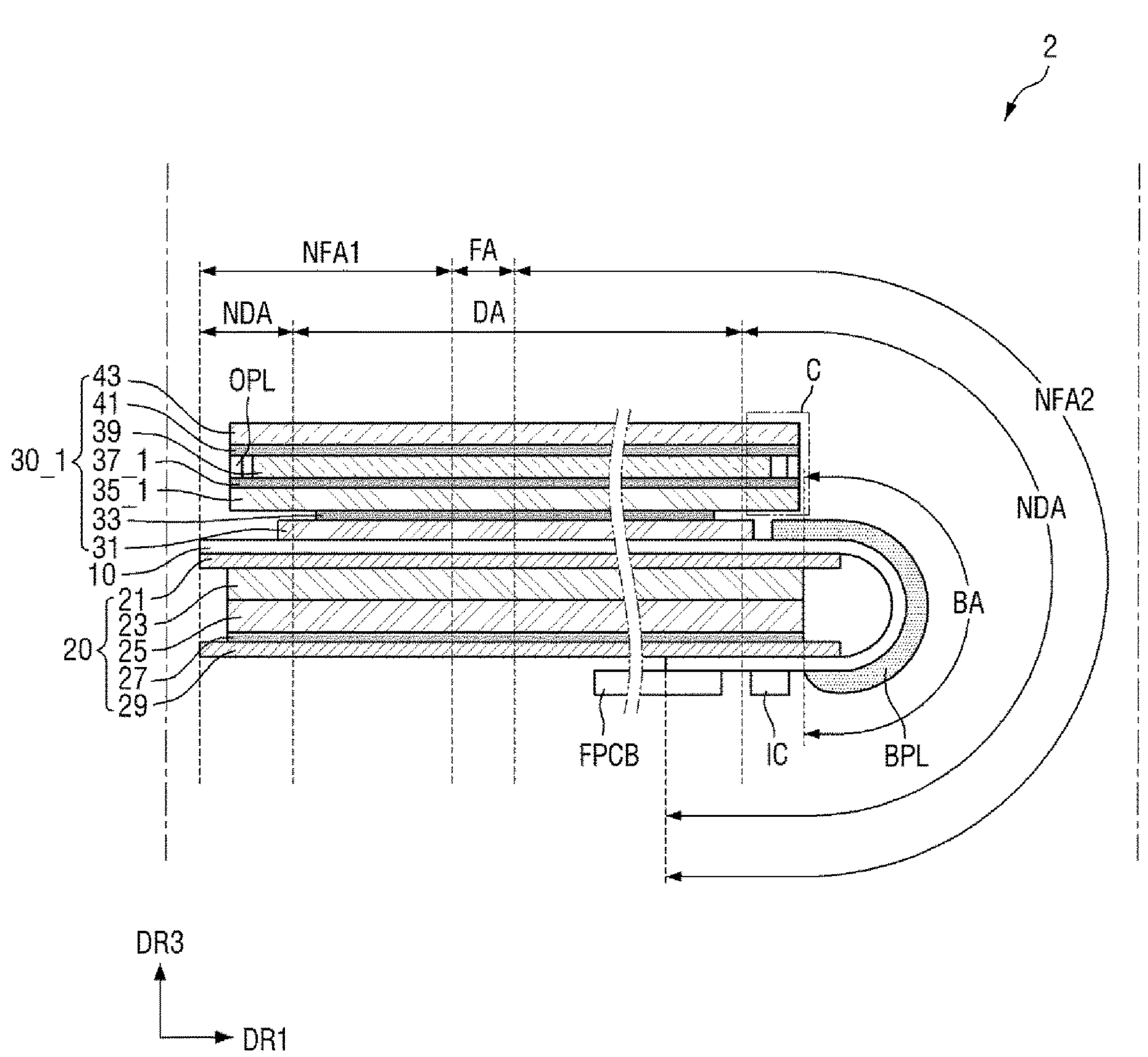
FIG. 12 is a cross-sectional view of another exemplary embodiment of a display device constructed according to principles of the invention.
Figure 13:
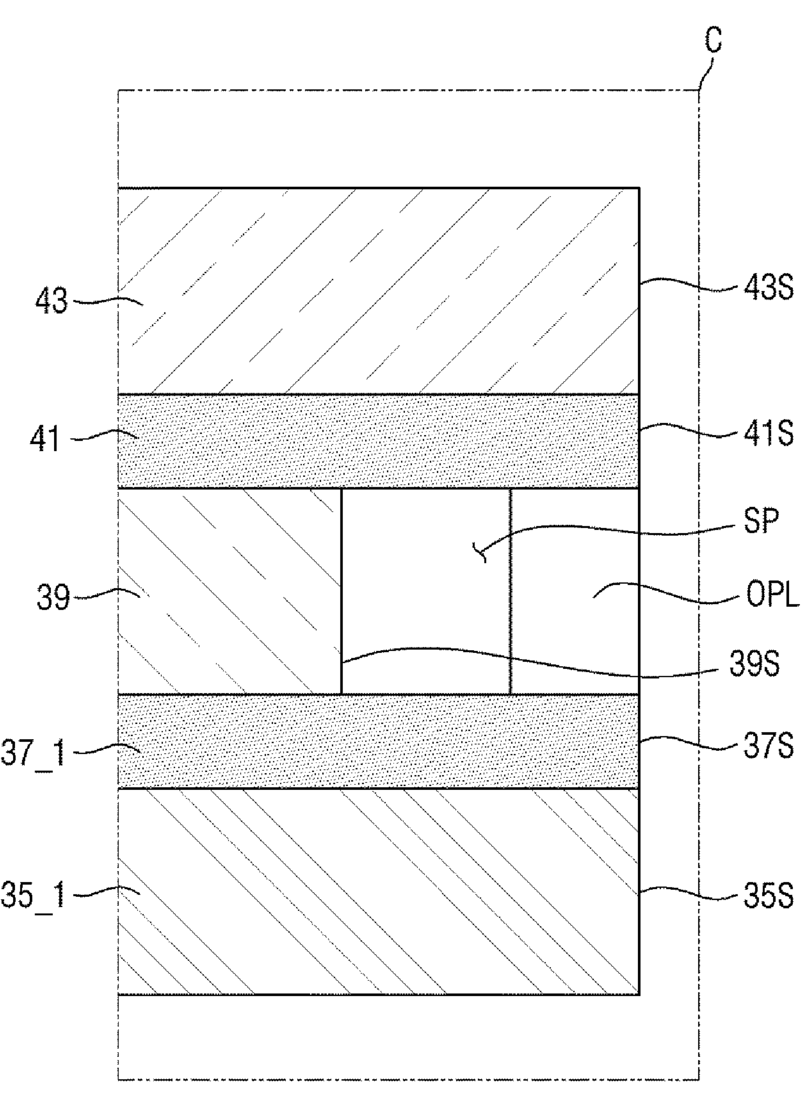
FIG. 13 is an enlarged cross-sectional view of an area C of FIG. 12.
Figure 14:
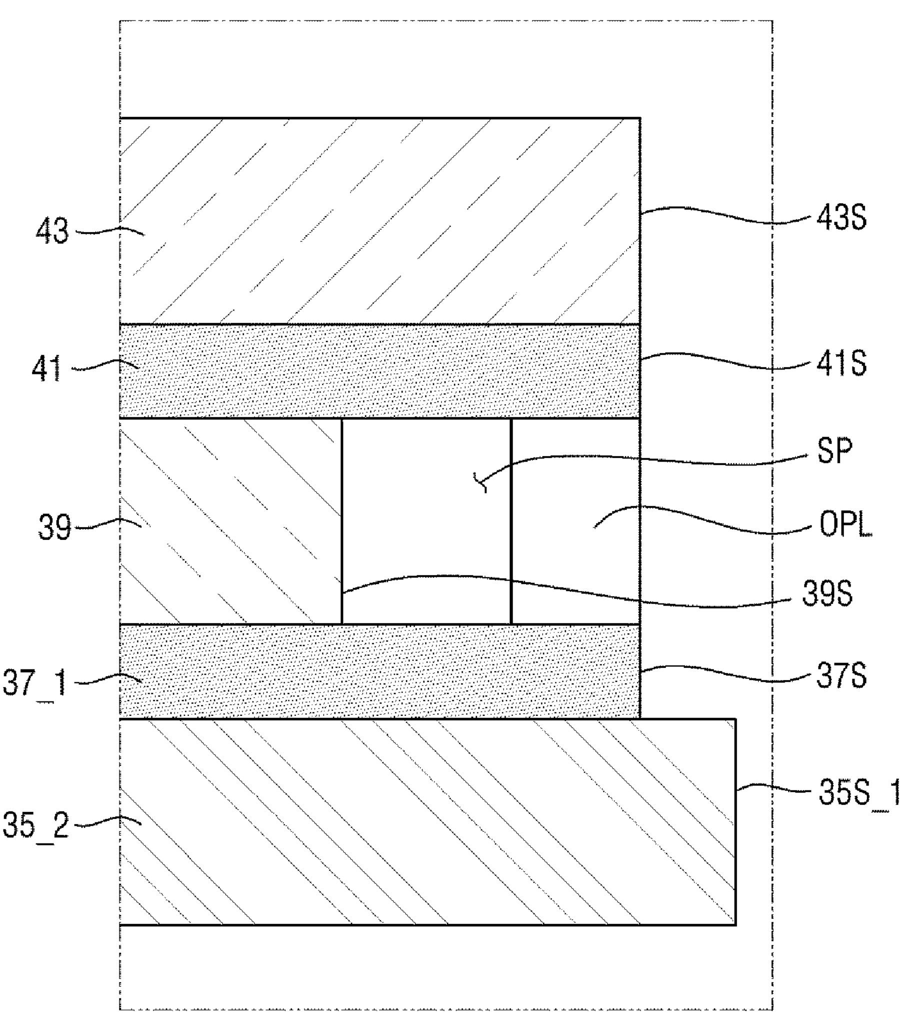
FIG. 14 is an enlarged cross-sectional view of a modified example of the area C of FIG. 13.

FIG. 12 is a cross-sectional view of another exemplary embodiment of a display device constructed according to principles of the invention. FIG. 13 is an enlarged cross-sectional view of an area C of FIG. 12. FIG. 14 is an enlarged cross-sectional view of a modified example of the area C of FIG. 13.

Referring to FIGS. 12 and 13, a display device 2 differs from the display device 1 of FIGS. 4 and 10 in that a side surface 39S of a window layer 39 is disposed more inwardly (in a direction from a first or second substantially non-folding area NFA1 or NFA2 to a folding area FA) than, or recessed from, a side surface 35S of a shock absorbing layer 35_1.

Specifically, the side surface 39S of the window layer 39 is disposed more inwardly (in the direction from the first or second substantially non-folding area NFA1 or NFA2 to the folding area FA) than, or recessed from, the side surface 35S of the shock absorbing layer 35_1.

The side surface 35S of the shock absorbing layer 35_1 and the side surface 43S of the protective layer 43 may be aligned in the thickness direction. The shock absorbing layer may have a larger size than the window layer 39 in a plan view.

A side surface 37S of a window layer-shock absorbing layer bonding layer 37_1 may be aligned with the side surface 35S of the shock absorbing layer 35_1 in the thickness direction.

An upper stack structure 30_1 may further include an outer protective layer OPL, which is disposed between the shock absorbing layer 35_1 and the protective layer 43.

The outer protective layer OPL may be spaced apart from the side surface 39S of the window layer 39 by a space SP. The outer protective layer OPL may be disposed more outwardly (in a direction from the folding area FA to the first or second substantially non-folding area NFA1 or NFA2) than the side surface 39S of the window layer 39. The outer protective layer OPL and the window layer 39 may be disposed in the same layer.

A protective layer-window layer bonding layer 41 may be disposed between the outer protective layer OPL and the protective layer 43. The outer protective layer OPL and the protective layer 43 may be bonded together by the protective layer-window layer bonding layer 41.

The window layer-shock absorbing layer bonding layer 37_1 may be disposed between the outer protective layer OPL and the shock absorbing layer 35_1. The outer protective layer OPL and the shock absorbing layer 35_1 may be bonded together by the window layer-shock absorbing layer bonding layer 37_1.

The outer protective layer OPL may protect the outer sides (or the side surface 39S) of the window layer 39. The outer protective layer OPL may include an organic material or an inorganic material.

The protective layer 43 may have a larger size than the window layer 39 in a plan view. The side surface 43S of the protective layer 43, which is disposed on the window layer 39, may extend outwardly (in the direction from the folding area FA to the first or second substantially non-folding area NFA1 or NFA2) beyond the side surface 39S of the window layer 39. The side surface 39S of the window layer 39 may be disposed more inwardly than part of the bending area BA of the display panel 10 where an extension of the third direction DR3 and the first surface of the bending area BA of the display panel 10 meet when the display panel 10 is bent, i.e., an outermost part BP.

Thus, when the side surface 39S of the window layer 39 slips outwardly (in the direction from the folding area FA to the first or second substantially non-folding area NFA1 or NFA2), peripheral parts of the window layer 39 (e.g., end parts of the window layer 39 in the first and second substantially non-folding areas NFA1 and NFA2) can be prevented from being damaged, or any cracks or grooves on the window layer 39 can be prevented from being propagated further into the window layer 39. Therefore, the window layer 39 can be protected in advance from being broken and shattered.

Also, since the outer protective layer OPL is further provided to protect the outer sides (or the side surface 39S) of the window layer 39, the window layer 39 can be further protected from being damaged.

FIG. 14 is an enlarged cross-sectional view of a modified example of the area C of FIG. 13.

Referring to FIG. 14, a display device of FIG. 14 differs from the display device 2 of FIGS. 12 and 13 in that a shock absorbing layer 35_2 extends more outwardly (in a direction from a folding area FA to a first or second substantially non-folding area NFA1 or NFA2) beyond a side surface 43S of a protective layer 43.

Specifically, the shock absorbing layer 35_2 extends more outwardly (in the direction from the folding area FA to the first or second substantially non-folding area NFA1 or NFA2) beyond the side surface 43S of the protective layer 43.

Other features of the display device of FIG. 14 are the same or similar as those of the display device 2 of FIGS. 12 and 13, and thus, detailed descriptions thereof will be omitted to avoid redundancy.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
a display panel including a first surface through which an image is displayed;
a first bonding layer on the display panel;
a window layer on the first bonding layer and including a glass or a quartz, the first bonding layer being between the window layer and the display panel; and
a protective layer on the window layer and including a polymer film,
wherein the protective layer has a larger size than the window layer in a plan view,
wherein both a first edge of the protective layer and a second of the protective layer facing the first edge protrude outward beyond edges of the window layer in the plan view, and
wherein the first bonding layer has a smaller size than the window layer in the plan view.

2. The display device of claim 1,
wherein a side surface of the protective layer extends outwardly beyond a side surface of the window layer.

3. The display device of claim 1,
wherein the display panel has a larger size than the window layer in the plan view.

4. The display device of claim 3,
wherein the display panel has a larger size than the protective layer in the plan view.

5. The display device of claim 1,
wherein the polymer film includes one of a polyethylene terephthalate (PET), a polyethylene naphthalate (PEN), a polyimide (PI), a polyarylate (PAR), a polymethyl methacrylate (PMMA), and a cycloolefin copolymer (COC) resin.

6. The display device of claim 1, wherein the display panel includes a bendable area.

7. The display device of claim 6, wherein a side surface of the window layer is disposed more inwardly than an outermost part of the bendable area of the display panel.

8. The display device of claim 6, wherein a side surface of the first bonding layer is inclined with respect to a portion of the first surface of the display panel outside of the bendable area.

9. The display device of claim 1, wherein a first side surface of the protective layer extends outwardly beyond a first side surface of the window layer, and a second side surface of the protective layer opposite the first side surface extends outwardly beyond a second side surface of the window layer.

10. The display device of claim 1, further comprising:

a polarizing layer between the display panel and the window layer.

11. A display device comprising:

a display panel having a foldable area, a first non-foldable area disposed on a first side of the folding area, and a second non-foldable area disposed on a second side of the folding area;

a window layer on the display panel and including a glass or a quartz;

a first bonding layer between the display panel and the window layer; and a protective layer on the window layer and including a polymer film, wherein the protective layer has a larger size than the window layer in a plan view, wherein both a first edge of the protective layer and a second of the protective layer facing the first edge protrude outward beyond edges of the window layer in the plan view, and wherein the first bonding layer has a smaller size than the window layer in the plan view.

12. The display device of claim 11, wherein a side surface of the protective layer extends outwardly beyond a side surface of the window layer.

13. The display device of claim 11, wherein the display panel has a larger size than the window layer in the plan view.

14. The display device of claim 13, wherein the display panel has a larger size than the protective layer in the plan view.

15. The display device of claim 11, wherein the polymer film includes one of a polyethylene terephthalate (PET), a polyethylene naphthalate (PEN), a polyimide (PI), a polyarylate (PAR), a polymethyl methacrylate (PMMA), and a cycloolefin copolymer (COC) resin.

16. The display device of claim 11, wherein the protective layer comprises a first surface facing the window layer, and a second surface opposite to the first surface of the protective layer, and when the display device is folded, portions of the second surface of the protective layer face each other.

17. The display device of claim 16, wherein a first side surface of the protective layer extends outwardly beyond a first side surface of the window layer, and a second side surface of the protective layer opposite the first side surface extends outwardly beyond a second side surface of the window layer.

18. The display device of claim 11, further comprising:

a polarizing layer between the display panel and the window layer.

* * * * *